(12) United States Patent  (10) Patent No.: US 7,460,015 B2
Forster et al.  (45) Date of Patent: Dec. 2, 2008

(54) RFID DEVICE WITH CHANGEABLE CHARACTERISTICS

(75) Inventors: Ian J. Forster, Chelmsford (GB); Yukihiko Sasaki, Claremont, CA (US)

(73) Assignee: Avery Dennison Corporation, Pasadena, CA (US)

( * ) Notice: Subject to any disclaimer, the term of this patent is extended or adjusted under 35 U.S.C. 154(b) by 0 days.

(21) Appl. No.: 11/864,850

(22) Filed: Sep. 28, 2007

(65) Prior Publication Data

US 2008/0018477 A1  Jan. 24, 2008

Related U.S. Application Data

(63) Continuation of application No. 10/886,831, filed on Jul. 7, 2004.

(60) Provisional application No. 60/485,313, filed on Jul. 7, 2003.

(51) Int. Cl.
*G08B 13/14* (2006.01)

(52) U.S. Cl. .............. 340/572.3; 340/572.5; 340/572.7; 340/10.5; 340/539.26; 340/539.27

(58) Field of Classification Search .............. 340/572.3, 340/572.5, 572.7, 10.5, 539.26, 539.27
See application file for complete search history.

(56) References Cited

U.S. PATENT DOCUMENTS

| 3,713,148 | A | 1/1973 | Cardullo et al. |
| 4,673,923 | A | 6/1987 | Boscoe et al. |
| 4,728,938 | A | 3/1988 | Kaltner |
| 4,835,524 | A | 5/1989 | Lamond et al. |
| 5,286,415 | A | 2/1994 | Buckley et al. |
| 5,469,142 | A | 11/1995 | Bergman et al. |
| 5,508,684 | A | 4/1996 | Becker et al. |
| 5,574,431 | A | 11/1996 | McKeown et al. |
| 5,589,820 | A | 12/1996 | Robinson et al. |
| 5,855,820 | A | 1/1999 | Chan et al. |
| 6,025,780 | A | 2/2000 | Bowers et al. |
| 6,050,622 | A | 4/2000 | Gustafson |

(Continued)

FOREIGN PATENT DOCUMENTS

CN  1330856 A  1/2002

(Continued)

OTHER PUBLICATIONS

"Overcoming the Consumer Privacy Concerns of Product Tracking Through RFID Tags", SANS Institute 2004, Steve Hankel, GIAC Security Essentials Certification (GSEC).

(Continued)

*Primary Examiner*—Tai T Nguyen

(57) ABSTRACT

An RFID device includes a first, relatively permanent portion and a second alterable or inactivatable portion. Upon the occurrence of some predetermined event, the second portion and/or its coupling to the first portion is physically altered, inactivating it. The first portion may itself be an antennaless RFID device that may be read at short range, and the second portion may be an antenna that, when coupled to the first portion, substantially increases the range at which the first portion may be read. The second portion may be configured to be altered or inactivated by any of a variety of predetermined events, such as involving physical, chemical or electrical forces, performed either on the RFID device, or upon an object to which the RFID device is coupled.

24 Claims, 6 Drawing Sheets

U.S. PATENT DOCUMENTS

| | | | |
|---|---|---|---|
| 6,091,607 | A | 7/2000 | McKeown et al. |
| 6,107,920 | A | 8/2000 | Eberhardt et al. |
| 6,154,137 | A | 11/2000 | Goff et al. |
| 6,181,248 | B1 | 1/2001 | Fockens |
| 6,206,292 | B1 | 3/2001 | Robertz et al. |
| 6,262,292 | B1 | 7/2001 | Yasuda et al. |
| 6,317,028 | B1 | 11/2001 | Valiulis |
| 6,407,669 | B1 * | 6/2002 | Brown et al. ............ 340/572.1 |
| 6,466,131 | B1 | 10/2002 | Tuttle et al. |
| 6,480,110 | B2 | 11/2002 | Lee et al. |
| 7,012,531 | B2 | 3/2006 | Fries et al. |
| 2002/0003496 | A1 * | 1/2002 | Brady et al. .......... 343/700 MS |
| 2002/0067264 | A1 | 6/2002 | Soehnien |
| 2002/0117543 | A1 | 8/2002 | Kocznar et al. |
| 2003/0080853 | A1 | 5/2003 | Tuttle |
| 2005/0275540 | A1 | 12/2005 | Halope et al. |
| 2006/0017570 | A1 | 1/2006 | Moskowitz et al. |
| 2006/0061475 | A1 | 3/2006 | Moskowitz et al. |
| 2006/0132313 | A1 | 6/2006 | Moskowitz et al. |

FOREIGN PATENT DOCUMENTS

| | | |
|---|---|---|
| CN | 1406361 A | 3/2003 |
| WO | 2002-077939 A | 3/2002 |
| WO | 2002-084584 | 10/2002 |

OTHER PUBLICATIONS

"RFID Backlash Prompts 'Kill' Feature", by Junko Yoshida, Apr. 28, 2003, Internet URL: http://www.eetimes.com/article/showArticle.jhtml?articled=12803964.

"ELocity Inc., Friday's Stock Focus Alerts You on RFID Technology", Florida, Apr. 16, 2004, Internet URL: boston.com.

"EnXnet's Emerging t\technology Solves Privacy Concerns", Oklahoma, Apr. 15, 2004, Internet URL: boston.com.

"EnXnet's RFID Deactivation Device Vital Role in the Consumer Marketplace", Oklahoma, Apr. 20, 2004, Internet URL: boston.com.

Written Opinion dated Mar. 15, 2005 from corresponding International Application No. PCT/US04/21951.

Chapter II Demand for Preliminary Examination and Amendment under Article 19 dated May 27, 2005 from corresponding International Application No. PCT/US04/21951.

International Preliminary Report on Patentability dated Mar. 5, 2008 from corresponding International Application No. PCT/US04/21951.

Restriction Requirement dated Mar. 27, 2006 from U.S. Appl. No. 10/886,831.

Response to Restriction Requirement and Information Disclosure Statement dated Arp. 25, 2006 from U.S. Appl. No. 10/886,831.

Office Action dated Jul. 10, 2006 from U.S. Appl. No. 10/886,831.

Amendment dated Sep. 19, 2006 from U.S. Appl. No. 10/886,831.

Office Action dated Dec. 14, 2006 from U.S. Appl. No. 10/886,831.

Amendment dated Mar. 9, 2007 from U.S. Appl. No. 10/886,831.

Office Action dated Mar. 14, 2007 from corresponding EP Application No. 04777809.7.

Office Action dated May 31, 2007 from U.S. Appl. No. 10/886,831.

Amendment dated Jun. 28, 2007 from U.S. Appl. No. 10/886,831.

Notice of Aloowance dated Sep. 10, 2007 from U.S. Appl. No. 10/886,831.

Supplemental Notice of Allowance dated Nov. 13, 2007 from U.S. Appl. No. 10/886,831.

Supplemental Notice of Allowance dated Nov. 29, 2007 from U.S. Appl. No. 10/886,831.

Notice of Allowance dated Feb. 12, 2008 from U.S. Appl. No. 10/886,831.

Office Action dated Apr. 4, 2008 from U.S. Appl. No. 11/642,804 which is a divisional of U.S. Appl .No. 10/886,831.

Juels, A. et al. "The Blocker Tag: Selective Blocking of RFID Tags for Consumer Privacy"; Oct. 27-30, 2003.

"Archieve Breakthrough Performance through RFID Radio Frequency Identification Technology", Internet URL: http://www.rfida.com/rfidtech.htm; dated Aug. 30, 2004.

"NCR Prototype Kiosk Kills RFID Tags", RFID Journal, Internet URL: http://www.rfidjournal.com/article/articleprint/585/-1/1; dated Sep. 25, 2003.

"STMicroelectronics Launches UHF RFID Chip Fully Supporting EPCglobal Class 1 Specification", Internet URL: http://www.st.com/stonline/press/news/year2004/p1462m.htm; dated Jun. 18, 2004.

* cited by examiner

RFID DEVICE WITH CHANGEABLE CHARACTERISTICS

RELATED APPLICATIONS

This Application is a Continuation of application Ser. No. 10/886,831 filed on Jul. 7, 2004 which claims priority of Provisional Application No. 60/485,313 filed on Jul. 7, 2003.

BACKGROUND OF THE INVENTION

1. Field of the Invention

This invention relates to the field of radio frequency identification (RFID) tag and label detection systems, and to methods of detecting RFID tags and labels.

2. Description of the Related Art

Radio frequency identification (RFID) tags and labels (collectively referred to herein as "devices") are widely used to associate an object with an identification code. RFID devices generally have a combination of antennas and analog and/or digital electronics, which may include for example communications electronics, data memory, and control logic. For example, RFID tags are used in conjunction with security-locks in cars, for access control to buildings, and for tracking inventory and parcels. Some examples of RFID tags and labels appear in U.S. Pat. Nos. 6,107,920, 6,206,292, and 6,262,292, all of which are hereby incorporated by reference in their entireties.

As noted above, RFID devices are generally categorized as labels or tags. RFID labels are RFID devices that are adhesively or otherwise have a surface that is attached directly to objects. RFID tags, in contrast, are secured to objects by other means, for example by use of a plastic fastener, string or other fastening means. Nevertheless, RFID devices are referred to herein somewhat interchangeably as "tags" or "labels."

RFID devices include active tags and labels, which include a power source, and passive tags and labels, which do not. In the case of passive tags, in order to retrieve the information from the chip, a "base station" or "reader" sends an excitation signal to the RFID tag or label. The excitation signal energizes the tag or label, and the RFID circuitry transmits the stored information back to the reader. The "reader" receives and decodes the information from the RFID tag. In general, RFID tags can retain and transmit enough information to uniquely identify individuals, packages, inventory and the like. RFID tags and labels also can be characterized as to those to which information is written only once (although the information may be read repeatedly), and those to which information may be written during use. For example, RFID devices may store environmental data (that may be detected by an associated sensor), logistical histories, state data, etc.

In activating, reading, and/or detecting RFID devices, radio frequency (RF) fields are generally sent over a relatively long range, that is, over intervening free space. Thus detection of devices is accomplished over a significantly-sized region, and spatial discrimination in reading and detection of devices may be difficult.

One concern that has been raised regarding RFID devices is that their ability to be read over relatively long distances may implicate privacy concerns for people having objects with RFID devices attached thereto or otherwise coupled thereto.

In addition, RFID devices may include commercially-sensitive information that is utilized in channels of commerce in supplying products to an end user. It may be desirable that this information rendered ungatherable or more difficult to gather after the product reaches the end user.

It will be appreciated that concerns about possible tracking or other privacy-related issues, or issues involving undesired dissemination of commercially-sensitive information, may inhibit some users from employing RFID devices. Accordingly, it will be appreciated that it would be desirable for RFID devices to avoid the above problems.

SUMMARY OF THE INVENTION

According to an aspect of the invention, an RFID includes at least a portion that has alterable characteristics.

According to another aspect of the invention, an RFID device has a first portion and an inactivatable second portion. The device may be read at a greater range when the second portion is not inactivated, than when the second portion is inactivated.

According to yet another aspect of the invention, an RFID device includes a first portion and an inactivatable second portion, wherein the inactivatable second portion includes an antenna. Even with the second portion inactivated, the RFID device may be read at short range.

According to a further aspect of the invention, an RFID device has a first portion and an inactivatable second portion, wherein the second portion may be inactivated by contact with a suitable solvent. The solvent may be a substance, such as water, that dissolves at least part of the inactivatable second portion, such as a substrate, and/or a material placed upon the substrate.

According to a still further aspect of the invention, an RFID device includes an inactivatable portion that is inactivated by contact with a suitable material having pre-determined characteristics. For example, the second portion may be inactivatable by exposure to water above a certain temperature, while not being inactivated by exposure to water below the given temperature. As another example, the inactivatable portion may be inactivated by exposure to water having an additive, such as a detergent, while not being inactivated by exposure to water without the additive.

According to another aspect of the invention, an RFID device includes a first portion and an inactivatable second portion, wherein the first portion is sealed to prevent contact with a solvent, abrasion, or other contaminants and/or potentially damage-producing situations.

According to another aspect of the invention, an RFID device is configured so as to change characteristics upon laundering of an object, such as a garment, to which the RFID device is attached or otherwise coupled.

According to a still further aspect of the invention, an RFID device includes a first portion and an inactivatable second portion, wherein the inactivatable second portion may be physically separated from the first portion along a predetermined boundary.

According to a further aspect of the invention, an RFID device includes a first portion and an inactivatable second portion wherein the second portion is inactivated by normal use of an object to which the RFID device is coupled.

According to a still further aspect of the invention, a radio frequency identification (RFID) device includes a first portion and a second portion operatively coupled to the first portion. The second portion is alterable upon occurrence of a predetermined event. The device has different electrical characteristics depending on whether the second portion is altered.

According to another aspect of the invention, a method of associating information with an object includes: coupling an RFID device to the object, wherein the RFID device is configured to change electrical characteristics during expected use of the object; and transferring the object to a user.

According to yet another aspect of the invention, a method of at least reducing accessibility of information associated with an object includes receiving an object with an RFID device coupled thereto, wherein the RFID device is configured to have read characteristics of the RFID device changed by occurrence of a predetermined event associated with ordinary use of the object; and changing read characteristics of the device by using the object in an ordinary way.

According to still another aspect of the invention, a radio frequency identification (RFID) device including a transponder chip; and an antenna coupled to the chip. Coupling between the chip and at least part of the antenna is alterable upon occurrence of a predetermined event. The device has different electrical characteristics depending on whether the coupling between the chip and the at least part of the antenna is altered.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings, which are not necessarily according to scale.

DETAILED DESCRIPTION

Figure 1:
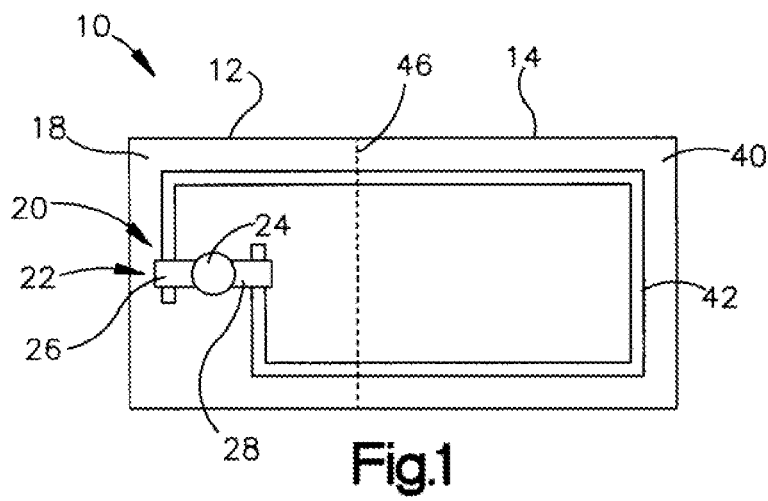
FIG. 1 is a plan view of an RFID device in accordance with the present invention.

An RFID device includes a first, relatively permanent portion and a second alterable or inactivatable portion. Upon the occurrence of some predetermined event, the second portion and/or its coupling to the first portion is physically altered, inactivating it. The first portion may itself be an antennaless RFID device that may be read at short range, and the second portion may be an antenna that, when coupled to the first portion, substantially increases the range at which the first portion may be read. The second portion may be configured to be altered or inactivated by any of a variety of tasks performed either on the RFID device, or upon an object to which the RFID device is coupled. Examples of ways in which the second portion may be inactivated include exposure to a suitable solvent, such as water used in a laundering process; tearing or otherwise physically separating the second portion from the first portion; other applications of physical force that may be part of regular use of the object to which the RFID device is coupled; and application of electrical forces.

In further explanation of a broad overview of the invention, an RFID device may include an electronic circuit such as an integrated circuit (also referred to herein as a chip), an antenna having one or more antenna elements, and an electrical coupling or connection between the electronic circuit and the antenna. The RFID device includes an alterable portion that alters or disables function of the RFID device upon occurrence of some predetermined event. A "predetermined event", as the term is used herein, is defined as some event that is likely to occur in normal transfer or use of an object to which the RFID device is coupled, but is not likely to occur prior to such normal transfer and use. A predetermined event may be a physical, chemical, or electrical event. The alterable portion may be a soluble portion, for instance a soluble antenna portion, that is dissolved in the presence of some solvent, for example in water or a water and detergent combination. The alterable portion may be a portion of the electrical coupling that changes composition (and thus its electrical coupling characteristics) when exposed to a suitable reactant. The alterable portion may be a portion of the coupling or antenna that alters or changes electrical characteristics (such as by narrowing or breaking) when subjected to a tensile force or an impact force. The alterable portion may include a portion that is severed or physically separated from the rest of the RFID device. The alterable portion that may include a portion that is configured to be altered in function by a suitable electrical event, such as by powering up of an electrical or electronic device which the RFID device is coupled to or which the RFID device is a part of. The electrical event may, for example, alter or disconnect portions of the antenna of the RFID device, or may disable or alter function of the chip of the RFID device.

Alteration of the alterable portion may cause the RFID device to become fully non-functional (non-readable or non-detectable). Alternatively, alteration of the alterable portion may cause the RFID device to continue functioning, but with altered characteristics. For instance, the altered characteristics may include a reduction in the distance at which the RFID device may be read or detected. This may be done by decoupling the RFID chip from the antenna, or by reducing the amount of the antenna that is effectively coupled to the RFID chip. Even when the RFID chip is decoupled from the antenna, the RFID chip may remain coupled to an interposer or strap, which may allow short-range detection of the RFID device.

The relatively-permanent portion of the RFID device may include an antennaless device, which may be read by a proximity detector. As used herein, the term "antennaless" refers broadly to devices lacking an antenna that is viable for receiving RF energy for remote, long-range reading. In characterizing antennaless devices, it is useful to compare them with well-known antennaed structures. An example of a well-known antenna structure is a dipole antenna with a good impedance match between the antenna and an RFID chip. A good impedance match provides good power transfer between antenna and chip. A dipole antenna has an antenna gain, relative to a perfect antenna, of approximately 2 dBi (decibels relative to an isotropic radiator—something that radiates equally in all directions). In a perfectly-impedance-matched situation, all of the power received by the antenna will be transmitted to the RFID chip.

Relative to structures described above having a perfect antenna or an impedance-matched dipole antenna, an "antennaless" structure will perform poorly. Such poor performance may in part be due to an inherently low antenna gain (due to small physical dimensions of the structure relative to wavelengths of RF energy). Another factor in poor performance of antennaless structures may be a poor impedance match between the chip and connected conductors (such as conductive leads), which manifests itself as a further power loss. Thus in an antennaless RFID device there may be losses, relative to an RFID device, due to small size of conductive structures that could receive RF energy, and/or due to poor impedance match, limiting efficiency of power transfer between the conductive structures and a chip of the device.

An antennaless RFID device, as the term is used herein, is defined as a device having a structure such that when it is placed in the far field of a transmitter (defined below), an RFID chip of the device that is attached to the structure will absorb −20 dB in power compared to an impedance-matched dipole antenna. Put in other words, the structure of an antennaless device, when placed in the far field of an RF transmitter, provides to an attached RFID chip 1% or less of the power that an impedance-matched dipole antenna would provide to the RFID chip.

An antennaless RFID device may be powered through use of a proximity locator, a device that generates a short-range RF field, with relatively low far-field RF radiation. The far field, as used herein, refers to a distance greater than about 15 mm from an RF-energy emitting device, such as device that emits UHF RF energy. Coupling of an RFID device in the far field is also referred to as "long-range coupling." The near field, where short-range coupling may occur, is defined as less than approximately 15 mm from an RF-energy emitting device. Placement of the RFID device in the near field is also referred to herein as placement of the device in "close proximity" to the proximity locator or parts of the proximity locator.

An example of UHF RF energy, referred to above, is RF energy in the range of 860 MHz to 950 MHz. However, it will be understood that a wide variety of other RF frequencies may be utilized, including frequencies other than UHF RF frequencies. For instance, frequencies of about 2-3 GHz may be utilized, although it will be appreciated that the short-range-coupling outer range limit from the RF-energy emitting device may be reduced when higher frequencies are employed.

A proximity detector of locator for detecting the presence of antennaed or antennaless RFID devices may include two or more conductors that create a suitable electrical field between the conductors or in the vicinity of the conductors. The conductors may be capacitively coupled to the RFID device to provide power to the RFID device, or to otherwise interact with the RFID device, allowing detection of devices in the vicinity of the electrical field.

Further information regarding proximity devices or locators may be found in commonly-owned U.S. application Ser. No. 10/406,702, which is herein incorporated by reference in its entirety.

Referring initially to FIG. 1, an RFID device 10 with changeable characteristics is shown. The RFID device 10 has a first portion 12 with relatively permanent read characteristics, and a second portion 14, which is inactivatable or otherwise changes characteristics.

The first portion 12 includes a first portion substrate 18 with an antennaless device 20 such as a strap or interposer 22 thereupon. The interposer or strap 22 includes a chip 24 (also referred to as a microchip) connected to conductive leads 26 and 28.

Figure 2:
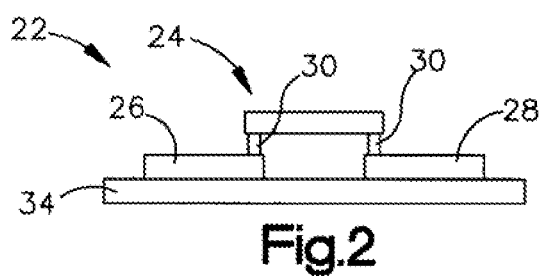
FIG. 2 is a cross-sectional side view of a prior art interposer or strap that may be part of the device of FIG. 1.

With reference now to FIG. 2, details of the interposer or strap 22 are now described further. As stated above, the interposer or strap 22 includes the chip 24 and the conductive leads 26 and 28. The leads 26 and 28 operatively coupled to chip contacts 30 of the chip 24. The chip 24 may be referred to herein in addition as an "electronic element." The chip 24 may include any of a variety of suitable electronic components, such as the circuitry described above for modulating the impedance of the RFID device 10.

The leads 26 and 28 may be completely made out of an electrically conducting material, such as being made out of a metal foil. Alternatively, the leads 26 and 28 may include an electrically insulating material, for example being plastic coated with metal. The interposer or strap 22 may include an interposer substrate 34 that is attached to the leads 26 and 28. The interposer substrate 34 may be made of any of a variety of suitable materials, for example, suitable flexible polymeric materials such as PET, polypropylene or other polyolefins, polycarbonate, or polysulfone. Alternatively or in addition the interposer substrate 34 may include a conductive material, such as a metal or a metal foil.

The interposer or strap 22 may be any of a variety of commercially-available interposers or straps. Examples include an RFID interposer or strap available from Alien Technologies, and the interposer or strap marketed under the name I-CONNECT, available from Philips Electronics. Alternatively, the interposer or strap 22 may be other than a commercially-available interposer or strap.

The leads 26 and 28 may have a length of approximately 7 mm. An antennaless RFID device with leads 7 mm long would be suitable for receiving RF energy at very high frequencies, on the order of 20 GHz, but would not be considered an antenna within the definition used herein.

More broadly, the leads may have a length of up to one-tenth of a wavelength at the operating frequency, although, as stated earlier it is desirable to minimize this for cost reasons. For example, a wavelength of 327.8 mm corresponds to an operating frequency of 915 MHz. Leads for such an operating frequency may have a length up to 33 mm.

It will be understood that the terms "interposer" and "strap" are not restricted to the embodiment just described. The terms "interposer" and "strap," as used herein, refer broadly to devices that include a microchip or other electronic circuitry, coupled to conductive leads. The conductive leads may be connected to contacts on the microchip or other circuitry by any of a variety of suitable methods.

The second portion 14 includes a second portion substrate 40 upon which an antenna or portion of an antenna 42 is located. The antenna 42 is coupled to the antennaless device 20 that is part of the first portion 12. The antenna 42 then coupled to the antennaless device 20, enables detection of the RFID device 10 as longer ranges, relative to the detection of the antennaless device 20 alone.

The second portion 14 may be inactivatable, or otherwise changed in operating characteristics, upon occurrence of one or more predetermined events. The event may involve physical separation of the second portion 14 from the first portion 12, such as by tearing, cutting, or severing along a boundary 46 between the first portion 12 and the second portion 14. Alternatively, as explained in greater detail below, a physical, electrical, or chemical process may be utilized to inactivate or otherwise change characteristics to the second portion 14. Examples of various ways in which the second portion 14 may be inactivated or otherwise changed are described below.

The second portion 14 is described above as including the antenna 42. It will be appreciated that the inactivatable portion may be other than an antenna. For example, the inactivatable portion may be only part of an antenna, changing the range or other characteristics of the RFID device. The inactivatable portion may be one or components of the RFID device, such that the operating frequency of the RFID device is altered by inactivation of the inactivatable portion of the device. For instance, inactivation of the inactivatable portion of the device may cause the device operating frequency to change, say from 915 MHz to 2450 MHz.

It will be appreciated that a wide variety of alternatives may be made in the configuration of the RFID device 10. For example, the RFID device 10 may have any of a variety of suitable antenna arrangements, and may have a wide variety of other suitable structures and/or configurations.

As another alternative, the RFID device 10 may be configured so that remote readability of the device is totally destroyed by inactivation of the inactivatable portion, such as the second portion 14. Such a device, when inactivated, may be detectible and/or readable only by contact methods, i.e., by methods involving actual physical contact with the chip 24.

Figure 3:
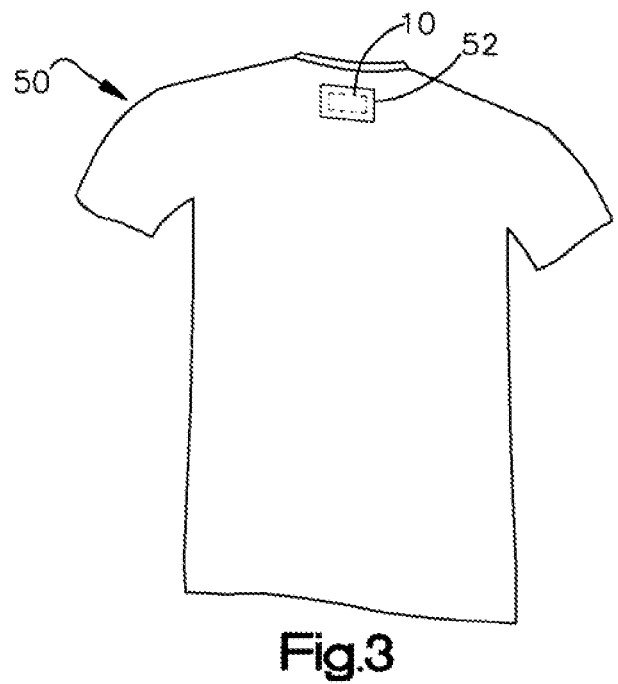
FIG. 3 illustrates the RFID device of FIG. 1 incorporated into a garment.

Referring to FIG. 3, the RFID device 10 may be coupled to a washable item, such as a piece of clothing 50, for example, being on or within a label 52 of the article of clothing 50. For example, the label 52 may be a thermally transferable label. The second portion 14 of the device 10 may be configured so as to be inactivated when the article of clothing 50 is laundered.

Figure 4:
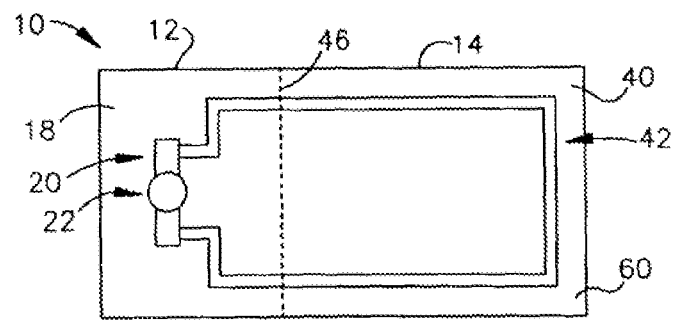
FIG. 4 is a plan view of one embodiment of the device of FIG. 1, a device with a soluble substrate.

As one example of such a device, illustrated in FIG. 4, the second portion substrate 40 may include a soluble material 60 that dissolves when exposed to a suitable solvent. For example, the soluble substrate 60 may be a water-soluble material, such as rice paper or another suitable material, that dissolves or otherwise breaks down when exposed to water. When the washable item 50 is laundered or otherwise exposed to water, the soluble substrate 60 would break down, thereby destroying the integrity of the second portion 14, and causing the antenna 42 to separate. However, at least part of the first portion 12, such as the part including the antennaless device 20, may be configured to remain active, and readable through use of a proximity locator or detector, as described above.

The label 52 may include other layers, such as a printable layer displaying text and/or graphics. Soluble layers such as the soluble substrate 60 may be laminated to the printable layer in such a way so that the text and/or graphics are viewable even after the soluble substrate 60 has been dissolved.

Figure 5:
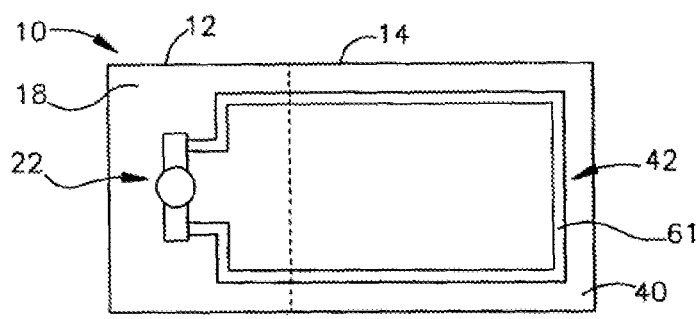
FIG. 5 is a plan view of another embodiment of the device of FIG. 1, a device with a soluble portion of an antenna.

Another alternative is shown in FIG. 5, wherein the antenna 42 includes at least a portion 61 that is made of a soluble conductive material that is soluble in water or another suitable solvent. Examples of suitable soluble conductive materials include soluble inks, such as those described in U.S. Pat. Nos. 5,286,415 and 5,855,820, both of which are herein incorporated by reference in their entireties. The antenna 42 may be formed by printing conductive ink on the substrate 40 of the second portion 14.

Figure 6:
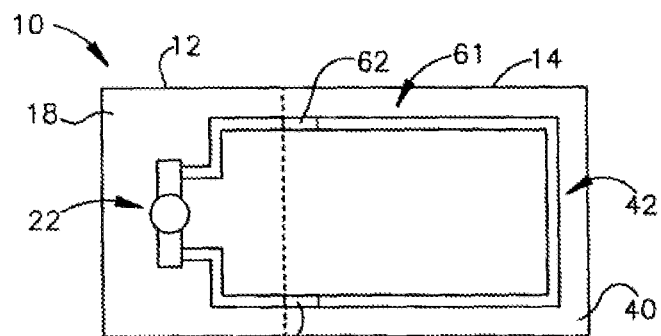
FIG. 6 is a plan view of yet another embodiment of the device of FIG. 1, a device with one or more soluble antenna links.

In a specific embodiment, illustrated in FIG. 6, the antenna portion 61 may be one or more soluble conductive links 62. Removal of the soluble conductive links 62 may deactivate the antenna 42 or decouple the antenna 42 from the first portion 12. Alternatively, the soluble conductive link 62 may be suitably located so as to merely alter the electrical characteristics of the antenna 42.

The first portion substrate 18 and the second portion substrate 40 may include suitable materials, for example, suitable flexible polymeric materials, such as those described above for the substrate 34 of the strap 22 (FIG. 2).

Figure 7:
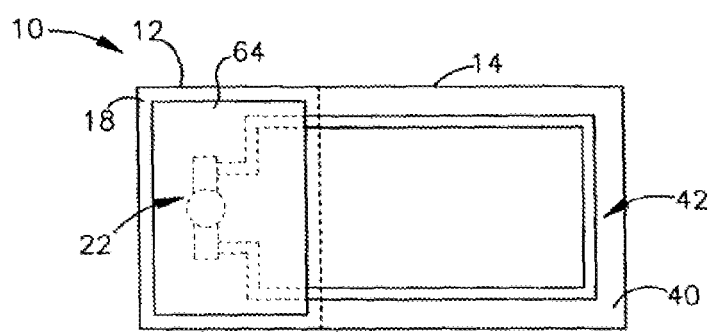
FIG. 7, is a plan view of an embodiment of the device of FIG. 1 that include a sealing material.

For the embodiment shown in FIG. 4, the first portion substrate 18 may be of a different material from that of the second portion substrate 40. Alternatively, or in addition, with reference to FIG. 7, a sealing material 64 may be used to seal all or part of the first portion 12 to protect the interposer or strap 22, for example, from exposure to the water or other solvent that is used to deactivate the second portion 14. The sealing material 64 may be a suitable epoxy or adhesive material.

It will be appreciated that the RFID device 10 that may be partially inactivated by washing could be used advantageously in a variety of situations in a garment. For example, the fully-operational RFID device 10, with the active second portion 14, may be used to track the garment 50, prior to sale, at relatively long range, such as in a far-field region. For example, long-range detection may be desirable in terms of inventory control tracking, facilitating gathering information for streamlining purchasing operations, and/or for theft prevention. Having the second portion 14 deteriorate during laundering may make the RFID device 10 less intrusive, for example, by reducing size and/or stiffness of the device, thereby improving comfort of the user of the garment 50. In addition, removing or changing the long-range detectability of the RFID device 10 may be advantageous to aid in maintaining privacy of the wearer or user of the garment 50. Still, it may be desirable to have means of short-range tracking of the RFID device 10, even when the second portion 14 has been inactivated. Such short-range detection of the RFID device 10 may aid in authenticating the garment 50, for example, in processing returns of the garment. For instance, a proximity locator or detector may be used to read information from the antennaless device 20 in a near-field region, to confirm that the garment 50 is being returned to the same store from which it was purchased.

Another alternative is for the device 10 to be configured so as to deteriorate substantially completely upon occurrence of a predetermined event. For example, the entire substrate of the device may be made of a water-soluble material, such as rice paper. Some small portion of the device, such as an interposer or strap, may remain after the predetermined event, such as laundering of a garment to which the RFID device 10 is coupled. Configuration of the device so that substantially the entire substrate of the device is made of a water-soluble material is a particularly advantageous version in regard to the advantage noted earlier, i.e. reducing the size and/or stiffness of the device in order to improve the comfort of the user of a garment carrying the device.

It will be appreciated that many variations are possible in terms of materials and/or solvents utilized. For example, the second portion substrate 40 and/or the material of the antenna 42 or other structures in the second portion 14, may be configured to inactivate or otherwise change characteristics in response to contact to a material other than water. For example, the second portion 14 may be configured to become inactive in response to contact with materials used in dry cleaning procedures, such as carbon tetrachloride. Alternatively, the second portion 14 may be configured to be inactivatable by exposure to water of a certain minimum temperature or to water containing a suitable detergent. It will be appreciated that such a feature may be utilized to reduce the probability of undesirable, accidental or deliberate inactivation of the long-range readability of the RFID device 10, or as a way of confirming that proper laundering of the garment 50 has taken place. For example, garments for use in a hospital may be configured to become partially or totally inactive only when washed in a minimum temperature of water. Long-range detection of laundered garments may be used to identify garments that have not been properly laundered, due to such garments retaining such long-range readability of RFID devices.

Water solubility of water-soluble material may be changed by changing the molecular weight of a polymer utilized in a soluble ink, for example by controlling crosslinking of the polymer. By increasing crosslinking of the polymer by a suitable amount, such as by a several-fold increase in molecular weight, the water-soluble material may become substantially insoluble in cold water, but still may remain soluble in hot water. The aforementioned U.S. Pat. Nos. 5,286,415 and 5,855,820 disclose methods to graft water-soluble and water-insoluble hydrophobic polymer. Water solubility can be controlled by the amount of hydrophobic polymer in the resultant graft copolymers.

Another alternative is a second portion 14 that includes a conductive material that has its conductivity characteristics altered by exposure to a predetermined substance or chemical, thereby changing the read characteristics of the RFID device. For example, the second portion 14 may have an antenna 42 may of different conductive materials, one of which is water-soluble (hydrophilic) and the other of which is insoluble, either by being a hydrophobic material or being coated to prevent contact with water. The water-soluble material may be on top of the insoluble material, so that exposure to water reduces the thickness of the antenna 42. Alternatively, the water-soluble material may be adjoining and in contact with the insoluble conductive material, so that exposure to water decreases the width of the antenna 42. It will be appreciated that a variety of other configurations may be obtained that give the antenna 42 changed electrical characteristics upon occurrence of a triggering event.

As another alternative, the RFID device 10 may include a portion that is dissolved by exposure to a chemical composition that is mixed and activated during use of the product. For example, the RFID device 10 may be placed on a barrier that is ruptured during activation of a device, such as a fluorescent device.

it will be appreciated that it may be possible to configure the RFID device 10 so that such changes in characteristics are reversible, so as to make the RFID device 10 re-usable as a detector of exposure to the chemical or substance. For example, exposure to a first substance could alter characteristics from a first state to a second, different state, while exposure to a second substance could alter the characteristics of the device back to the first state.

Many alternatives are possible for the location of a soluble substrate or substrate portion, or a soluble conductive link. For example, soluble conductive material may be used for a conductive link between the interposer or strap 22 and the rest of the RFID device 10. Removal of such soluble material may thereby electrically isolate the interposer or strap 22. As another alternative, a soluble adhesive may be used to physically couple the interposer or strap 22 to the rest of the RFID device 10. Dissolution of the adhesive may physically separate the interposer or strap 22 from the RFID device 10.

The RFID device 10 may include soluble structures other than antennas, removal of which (by contact with a suitable solvent) may change the operating characteristics of the RFID device 10. For example, a soluble adhesive may used to attach one part of the device 10 (such as an interposer or strap) to another part (such as the substrate with the conductive pattern (antenna) thereupon.

It will be appreciated that the RFID device 10 with a soluble portion or portions may be utilized in a wide variety of applications where an object is washed as part of its normal use, or otherwise comes into contact with a suitable solvent.

Figure 8:
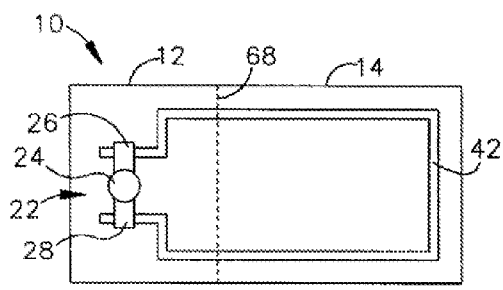
FIG. 8 is a plan view of an embodiment of the device of FIG. 1 that is configured to be severed.

FIG. 8 shows an RFID device 10 with a physically-separable second portion 14, which may be inactivated by physically separating it from the first portion 12 along a severing line 68. The severing may be any of a variety of physically separating processes, such as cutting or tearing. The severing line 68 may be an area that is perforated, scored, or otherwise configured to make the severing easier, and/or to encourage severing at the desired location along the severing line 68.

Alternatively or in addition, the severing line 68 may correspond to a visual indicator such as a printed line, to aid in locating the severing in a proper place. In addition, the RFID device 10 may have instructions thereupon, in words and/or symbols, directing an end user or other person to sever the RFID device 10 along the severing line 68, to physically separate the second portion 14 from the first portion 12. For example, the RFID device 10 may have instructions such as "CUT HERE" written thereupon, indicating to the user the severing line 68 where the second portion 14 is to be separated from the first portion.

The severing line 68 is shown in FIG. 8 as a straight line. However, it will be appreciated that the severing line 68 may more broadly be a boundary of any shape.

Figure 9A:
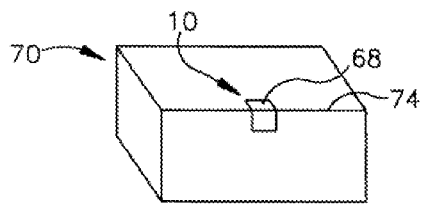
FIG. 9A shows the device of FIG. 8 attached to a container.

FIG. 9A shows the RFID device 10 of FIG. 8 mounted on an item 70 that has an opening seam 74, with the severing line 68 along the opening seam 74. The RFID device 10 is severed along the severing line 68, thereby inactivating the second portion 14, by opening of the item 70 along the opening seam 74. Thus, the item 70 may be a box or other container configured such that in order to conventionally open the container to access the inner contents, requires inactivating the second portion 14 of the RFID device 10 thereupon. A consumer then may be required to cut, tear, or otherwise sever the RFID device, for example, incapacitating long-range readability of the RFID device, in order to open the container.

The item 70 may be a box or a folder that contains an object or objects inside. Alternatively, the item 70 may be an object that includes a hinged or other openable portion, such as with a compact disk player with an opening for receiving a compact disk, or a hinged portable telephone that must be opened for operation.

Figure 9B:
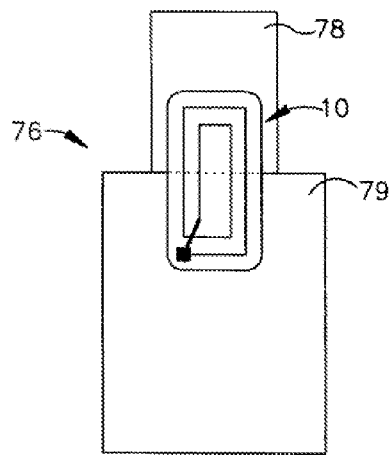
FIG. 9B shows another example of the device of FIG. 8 attached to a container.

FIG. 9B shows an alternative mounting for the RFID device 10 of FIG. 8, on a container 76 that has a removable top 78. The container 76 may be a container that has a screw-off or pull-off top 78, such as a container for holding perfume or medicines. The RFID device 10 may be adhered to the container 76 with parts of the device 10 adhered to the top 78 and a body 79 of the container 76, with the device 10 configured relative to the container 76 such that the severing line 68 of the device 10 is about at the location where the top 78 meets the body 79. When the container 76 is opened by separating the top 78 from the body 79, the RFID device 10 is severed, altering characteristics of the RFID device 10. For instance, the distance over which the RFID device 10 may be read may be reduced by the severing. Thus, once the product is used by opening the container 76, the RFID device 10 may be partially or fully reduced in function, protecting privacy of a consumer or end user.

In addition, the RFID device 10 shown in FIGS. 9A and 9B may be employed as an anti-tampering device. The location of the RFID device 10 may prevent opening of the item 70 or the container 76 without altering operation of the RFID device 10. Thus tampering prior to sale of the item 70 or the container 76 may be detectable by an RFID reader mounted in a display unit, such as a shelf, or at a point of sale location, such as a cash register. In addition, severing of the RFID device 10 may be detected visually, by either a retailer or a consumer. Thus tampering with products may be discouraged by making such tampering easily detectable.

Figure 10:
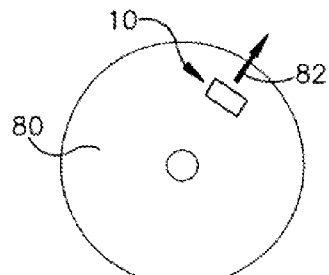
FIGS. 10-12 are views of various objects with RFID devices of the present invention coupled thereto, to be subjected to various physical forces during use of the objects.
Figure 11:
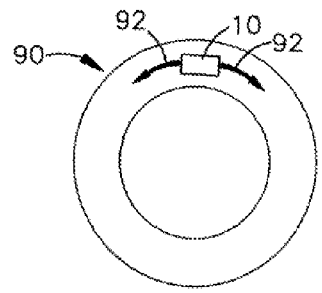
Figure 12:
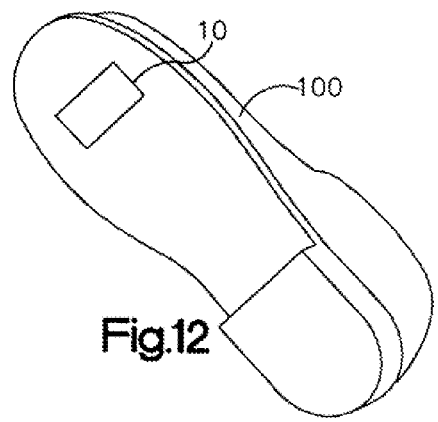

FIGS. 10-12 illustrate those situations where the RFID device is placed on an object and is thereby subjected to various types of physical forces encountered in ordinary use of the object. FIG. 10 shows the RFID device 10 on an object 80, such as a compact disk or a centrifuge, that may be subjected to centrifugal forces 82 in ordinary use. FIG. 11 shows the RFID device 10 on or as part of an object 90 that is subjected to stretching forces 92 during use. An example of an object 90 is a vehicle tire that is stretched during installation on a vehicle wheel. FIG. 12 shows an RFID device on an object, such as the sole of a shoe 100, that is subjected to abrasive or other wearing forces during regular use. In all of these configurations shown in FIGS. 10-12, the RFID device 10 may be configured such that the second portion 14 is subject to change by the physical forces encountered in use of the objects 80, 90, and 100, while the first portion 12 is less affected or unaffected by the various physical forces.

Figure 13A:
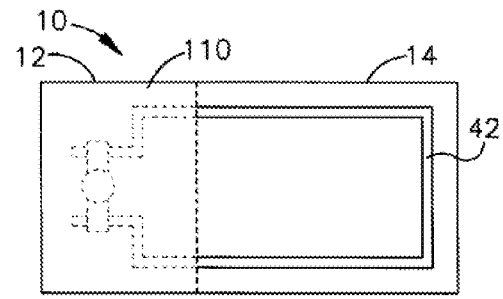
FIG. 13A is a plan view illustrating an RFID device of the present invention with a protective coating applied to a portion thereof.

With regard to FIG. 13A, the device 10 may have a strengthening coating 110 over at least part of the first portion 12, to provide strength or otherwise aid in protecting at least part of the first portion 12 from damage or other alterations due to physical force.

Figure 13B:
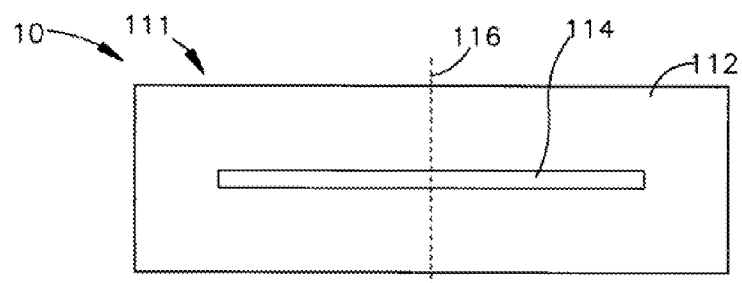
FIG. 13B is a plan view of a portion of an RFID device of the present invention that has electrical characteristics that are altered upon stretching of the device.

FIG. 13B shows a portion 111 of an RFID device 10 that has electrical characteristics that are alterable by stretching. The portion 110 has a substrate 112 with a conductive trace 114 thereupon. The conductive trace 114 may be a part of an antenna or other electrical connection. The substrate 112 may be any of a variety of suitable materials that could support a conductive trace, such as a conductive ink trace, and would be sufficiently stretchable to allow alteration of the electrical characteristics of the conductive trace. One broad category of suitable substrate materials is unoriented polyolefins, for example having a thickness from about 25 and 200 µm (microns). Another example of a suitable material for the substrate 114 is a suitable paper layer. The conductive trace 114 may be a silver ink trace printed on the substrate 112. When the portion 110 is in its unstretched state, the electrical resistance of the conductive trace 114 may be on the order of a few ohms.

When the substrate 112 is slightly (elastically) stretched, the resistance of the conductive trace 114 may be substantially unchanged. However, once the elastic limit of the substrate material is exceeded, and the substrate 112 significantly deforms, the resistance of the conductive trace 114 rapidly, non-reversibly increases. Putting a weak portion in the substrate 112, such as an indention or perforations 116, may concentrate the stretching forces, controlling and/or enhancing the change in the resistance of the conductive trace 114.

Figure 14:
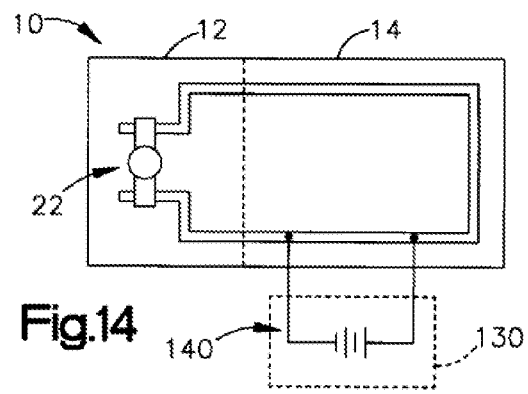
FIG. 14 is a schematic illustration showing electrical coupling between an RFID device of the present invention, and an object having a circuit.

Turning now to FIG. 14, the RFID device 10 may be configured such that the second portion 14 is inactivated or changed by occurrence of an electrical event. For example, the RFID device 10 may be coupled to object 130, such an electrical device, such that operation of circuitry 140 of the object 130 passes electrical power through all or part of the second portion 14 of the RFID device 10, inactivating or otherwise altering function of the second portion 14. For example, passing current through the second portion 14 may burn out all or a portion of an antenna 42 on the second portion 14.

Figure 15:
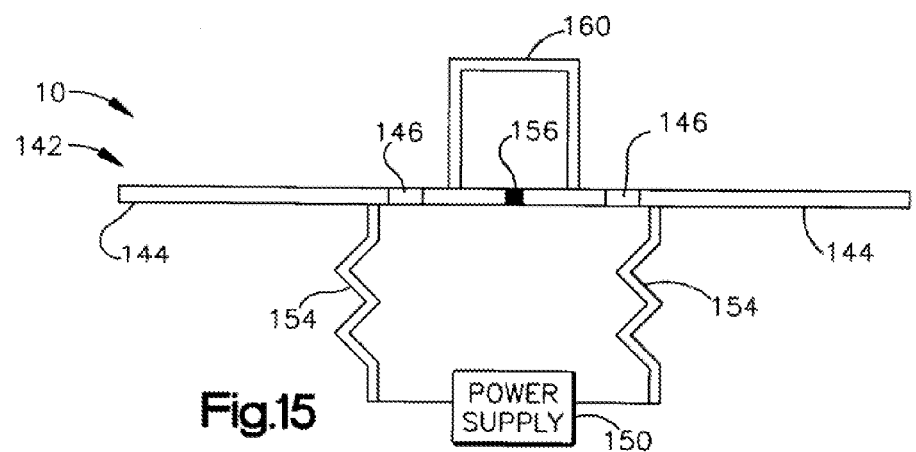
FIG. 15 is a plan view of an RFID device in accordance with the present invention, having fusible electrical connections.

It will be appreciated that a wide variety of electrical operations may be used to inactivate or otherwise alter function of the second portion 14. FIGS. 15-20 give a few examples of RFID devices 10 that may be inactivated, or have their operating characteristics changed, by occurrence of an electrical event. FIG. 15 shows a device 10 that has an antenna 142 that has antenna elements 144 with fusible sections 146 that become open circuits when power is supplied to the antenna by a power supply 150. The power supply 150 may represent power transmitted to the antenna 142 by operation of an object to which the RFID device 10 is coupled, or into which the RFID device 10 is incorporated. The object may be, for example, any of a wide variety of electrical devices.

The power supply 150 may be coupled to elements of the antenna 142 by RF chokes 154, which are conductive traces with desired characteristics. The antenna elements 144 may be coupled to an RFID chip (transponder) 156, and also may be linked together by a bypass inductor 160, which links the elements 144 around the RFID chip 156.

Once power is supplied to the antenna elements 144 by the power supply 150, such as by operation of the object, the fusible portions 146 of the antenna 142 are melted or otherwise rendered as open circuits. This decouples the RFID chip 156 from at least portions of the antenna elements 144, changing characteristics of the RFID device 10.

Figure 16:
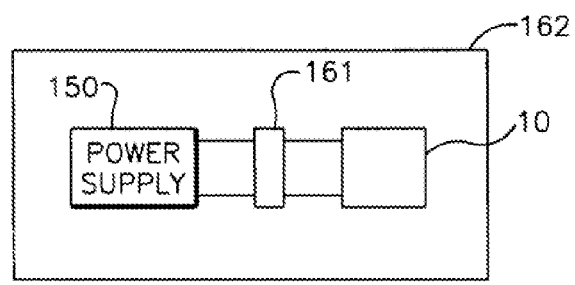
FIG. 16 is a schematic illustration of the device of FIG. 15, incorporated into a computer.

As noted above, the power supply 150 may be a power supply of a device or object, which automatically directly applies a DC voltage to the RF chokes 154 when operation of an electrical circuit is commenced. It will be appreciated that a wide variety of alternatives may be possible for the power supply 150. For example, the power supply 150 may be a switched supply, such that a user may be given the option of whether to apply power to the RFID device. The power supply 150 may be a user-controlled switchable power supply. For instance, as shown in FIG. 16, the RFID device 10 may be coupled to a port 161 of a computer 162 that is under control of the computer. When a user first starts the computer 162, the user is given an option to apply power to the RFID device 10, to disable or reduce readability of the RFID device 10. It will be appreciated that this option allows users to retain enhanced readability of the RFID device 10 by leaving full function of the RFID device 10 enabled. This may be desirable for corporate or other users, for instance, to allow tracking and identification of frequently-stolen items, such as laptop computers.

Figure 17:
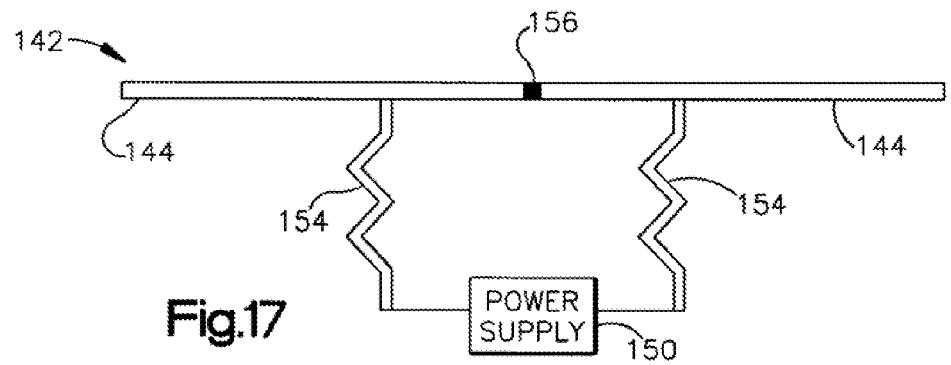
FIG. 17 is a plan view of an RFID device in accordance with the present invention having an alterable RFID chip.

FIG. 17 shows a configuration of the RFID device 10 wherein power from the power supply 150 is applied directly to the RFID chip 156. When power is supplied to the RFID chip 156 from the power supply 150, some or all of the functionality of the RFID chip 156 may be destroyed.

The power supply 150 may be configured to provide a suitable voltage and current to alter or destroy functionality of the RFID chip 156. For example, the power supply 150 may be a 12-volt power supply used to run internal components of an electrical or electronic device. Alternatively, the power supply 150 may provide a higher voltage, such as voltages on the order of hundreds of volts, used to power electroluminescent backlights on telephones and computers.

Figure 18:
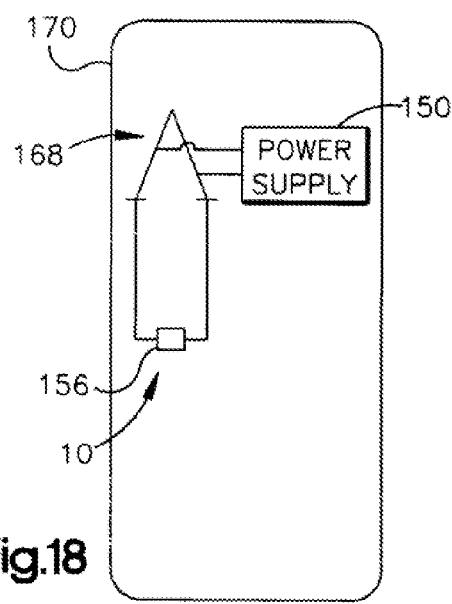
FIG. 18 is a schematic illustration of an RFID device having an alterable RFID chip, incorporated into a mobile telephone.

According to another alternative, illustrated in FIG. 18, the RFID chip 156 of an RFID device 10 may be coupled to an antenna 142 of a mobile telephone 170. Prior to powering up of the mobile telephone 170, the chip 156 may engage in long-range communicatation with RFID readers, via the antenna 142. However, applying the relatively high RF power of the power supply 150 of the mobile telephone 170 to the antenna 142 may disable or alter functionality of the RFID chip 156, disabling the readability of the RFID chip 156 at long ranges. As an alternative, the RFID device 10 may be configured such that the application of high RF power from a mobile telephone disables a fusible link, similar to the process described above with regard to the device of FIG. 15.

Figure 19:
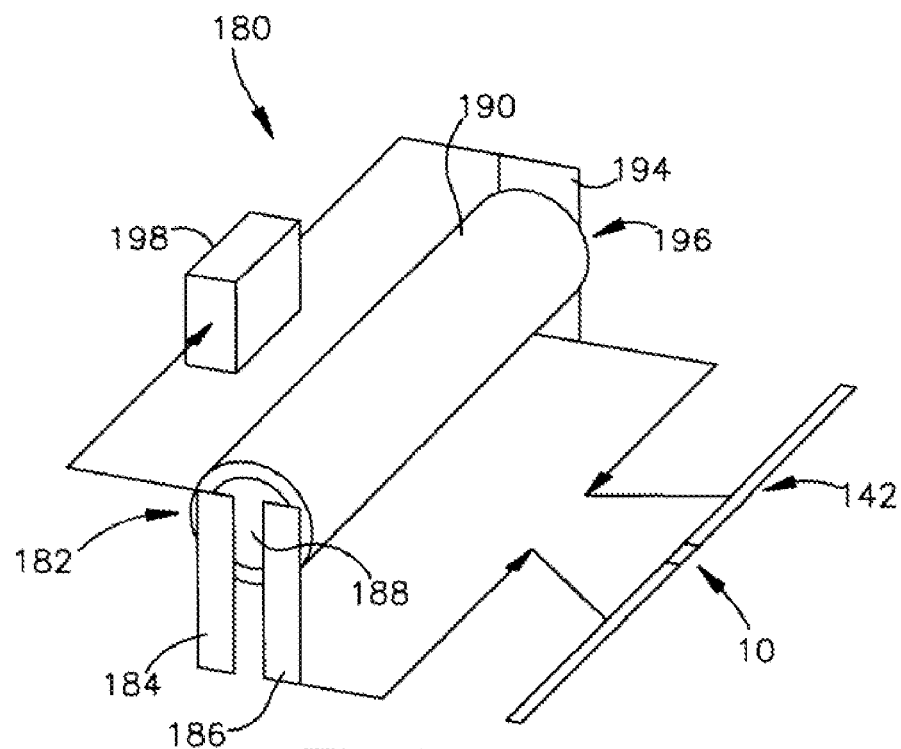
FIG. 19 is a view of an RFID device in accordance with the present invention, incorporated in a battery-operated device.

FIG. 19 shows a configuration that allows testing of a battery-powered electrical or electronic device 180 without impairing or destroying functionality of an RFID device 10 that is configured to change, or cease function during normal operation of the battery-powered device 180. A battery compartment or holder 182 provides a pair of first contacts 184 and 186 couplable to one pole 188 of the battery 190, and a second contact 194 couplable to an opposite pole 196 of the battery 190. In a normal operating condition, one of the first contacts 184 and the second contact 194 are coupled to an electrical or electronic device 198 to provide power to the device 198. Examples of such electrical or electronic devices include radios, CD players, and digital cameras. The other first contact 186 and the second contact 194 are coupled to the antenna 142 of the RFID device 10, to disable the RFID device 10 or to alter the functional characteristics of the RFID devices. This changing of the characteristics of the RFID device 10 may be accomplished using the methods described above with regard to the embodiments shown in FIGS. 15 and 17. Thus placement of the battery 190 in the battery holder 182 alters or destroys functionality of the RFID device 10.

Nonetheless, it will be appreciated that it may be desirable to test functioning of the electrical or electronic device 198, while maintaining unaltered the functioning of the RFID device 10. This may be accomplished by somehow blocking connection of the battery 190 to the first contact 186 that is coupled to the RFID device 10. One way to do this is to use a special battery for testing the electrical or electronic device 198, a battery that does not have a pole that connects with the first contact 186. Another way of preventing premature de-activation of the RFID device 10 is to provide a special adaptor to be placed on the battery 190 or the battery holder 182 during testing, to prevent contact between the pole 188 of the battery 190 and the first contact 186 that is coupled to the RFID device 10.

Figure 20:
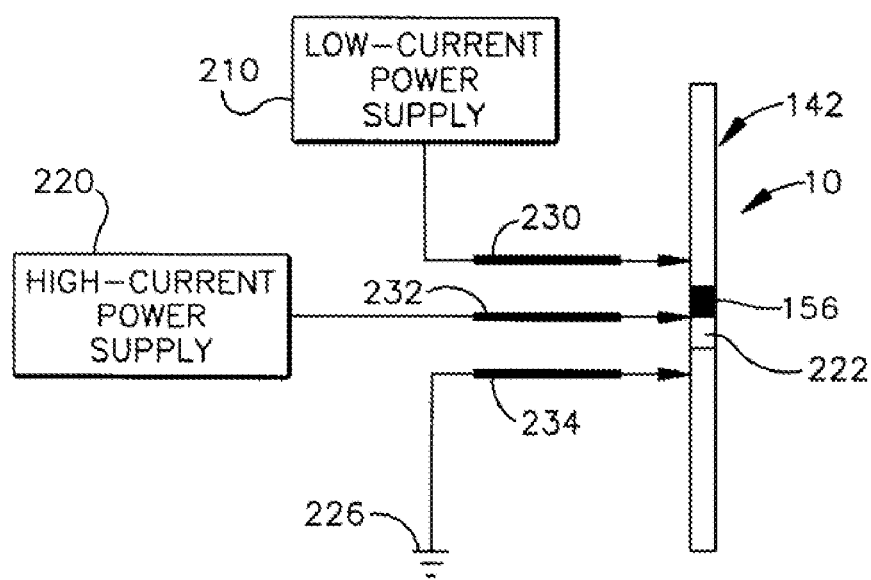
FIG. 20 is a view of a semi-passive RFID device in accordance with the present invention, having alterable characteristics.

FIG. 20 shows a semi-passive RFID device 10 that is configured to be powered by a low-current power supply 210. Such a low-current power supply 210 may be a power supply in a device for keeping a real-time clock or other components active even when a higher-current main power supply 220 is off. The main power supply 220 is also coupled to the RFID device 10 to de-activate or alter function of the RFID device 10 when the main power supply 220 is activated. This alteration of function may come from a fusible link 222 between where the main power supply 220 is coupled to an antenna 142 of the RFID device 10, and where the antenna 142 is coupled to an electrical system ground 226. The low-current power supply 210, the main power supply 220, and the system ground 226 are coupled to the antenna 142 through respective RF choke sections 230, 232, and 234.

The semi-passive RFID device 10 may have a longer range than passive RFID devices that rely on a rectified RF signal for power. The detection range of such a semi-passive device may be up to 5 times that of a passive device.

The various types of RFID devices disclosed herein, with inactivatable or alterable portions that may be altered or inactivated by chemical, physical, or electrical processes, may be linked by a common concept, that of an RFID device that is altered or inactivated by events associated with sale or other transfer of an item, and/or by events associated with normal expected use of an item. Thus garments are expected to be laundered, containers containing goods opened, vehicle tires stretched during the mounting process, electrical devices powered up, and shoes worn along their soles. As described above, RFID devices may be configured to provide alterable characteristics in each of the listed situations, through a variety of mechanisms.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of altering read, transmit or detection characteristics of a radio frequency identification (RFID) device, said method comprising the steps of:
   obtaining an RFID device, the RFID device comprising a substrate, a transponder chip and an antenna coupled to the chip; and
   reducing a read, transmit or detection range of the RFID device via reducing an amount of the antenna that is coupled to the chip;
   wherein said step of reducing the amount of the antenna comprises altering a substantial portion of the substrate and/or the antenna;
   wherein the RFID device is initially operable within an original range; and wherein said step of reducing the read, transmit or detection range comprises leaving a remainder device sufficient for responding to a signal solely at a range shorter than the original range.

2. The method according to claim 1, wherein said step of leaving a remainder comprises leaving a remainder device sufficient for responding to a signal solely at a range less than approximately 15 mm.

3. The method according to claim 1, wherein said step of altering a substantial portion of the substrate and/or the antenna comprises a step taken from a group of steps consisting of: exposing the device to a suitable solvent; laundering an object to which the device is coupled; and applying a physical force to at least part of the device.

4. The method according to claim 1, wherein the substrate and/or the antenna includes soluble material.

5. The method according to claim 4, wherein the soluble material includes a water-soluble material.

6. The method according to claim 4, wherein the soluble material includes a material that is soluble in a mixture of water and a laundry detergent.

7. The method according to claim 4, wherein the soluble material includes a material that is soluble when a solvent is in a predetermined temperature range.

8. The method according to claim 4, wherein the soluble material includes a material that is soluble in a dry cleaning fluid.

9. The method according to claim 4, wherein the soluble material includes a material that is soluble in carbon tetrachloride.

10. The method according to claim 1, wherein the antenna includes a soluble conductive material.

11. The method according to claim 10, wherein the soluble conductive material includes a soluble conductive ink.

12. The method according to claim 1, wherein said step of altering a substantial portion of the substrate and/or the antenna changes an operating frequency of the device.

13. A radio frequency identification (RFID) device comprising:
   a substrate, a transponder chip and an antenna coupled to the chip; and
   an arrangement for reducing a read, transmit or detection range of the RFID device via reducing an amount of the antenna that is coupled to the chip;
   wherein said arrangement for reducing a read or detection range comprises an arrangement for altering a substantial portion of the substrate and/or the antenna;
   wherein said RFID device is initially operable within an original range; and
   wherein said arrangement for reducing the read, transmit or detection range is adapted to leave a remainder device sufficient for responding to a signal solely at a range shorter than the original range.

14. The RFID device according to claim 13, wherein said arrangement for reducing the read, transmit or detection range is adapted to leave a remainder device sufficient for responding to a signal solely at a range less than approximately 15 mm.

15. The RFID device according to claim 13, wherein said arrangement for altering a substantial portion of the substrate and/or the antenna comprises an arrangement taken from a group of arrangements consisting of: an arrangement for facilitating exposing the device to a suitable solvent; an arrangement for facilitating laundering an object to which the device is coupled; and an arrangement for facilitating applying a physical force to at least part of the device.

16. The RFID device according to claim 13, wherein the substrate and/or the antenna includes soluble material.

17. The RFID device according to claim 16, wherein the soluble material includes a water-soluble material.

18. The RFID device according to claim 16, wherein the soluble material includes a material that is soluble in a mixture of water and a laundry detergent.

19. The RFID device according to claim 16, wherein the soluble material includes a material that is soluble when a solvent is in a predetermined temperature range.

20. The RFID device according to claim 16, wherein the soluble material includes a material that is soluble in a dry cleaning fluid.

21. The RFID device according to claim 16, wherein the soluble material includes a material that is soluble in carbon tetrachloride.

22. The RFID device according to claim 13, wherein the antenna includes a soluble conductive material.

23. The RFID device according to claim 22, wherein the soluble conductive material includes a soluble conductive ink.

24. The RFID device according to claim 13, wherein said arrangement for altering a substantial portion of the substrate and/or the antenna changes an operating frequency of the device.

* * * * *